United States Patent
Su et al.

(10) Patent No.: US 9,094,634 B2
(45) Date of Patent: Jul. 28, 2015

(54) AMPLIFIER FOR TELEVISION TUNER CHIP AND METHOD THEREFOR

(71) Applicants: Yu Su, Austin, TX (US); Mustafa H. Koroglu, Austin, TX (US); Ruifeng Sun, Austin, TX (US); Krishna Pentakota, Austin, TX (US); Pio Balmelli, Austin, TX (US); Ramin Khoini-Poorfard, Austin, TX (US)

(72) Inventors: Yu Su, Austin, TX (US); Mustafa H. Koroglu, Austin, TX (US); Ruifeng Sun, Austin, TX (US); Krishna Pentakota, Austin, TX (US); Pio Balmelli, Austin, TX (US); Ramin Khoini-Poorfard, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 59 days.

(21) Appl. No.: 13/910,392

(22) Filed: Jun. 5, 2013

(65) Prior Publication Data

US 2014/0361838 A1 Dec. 11, 2014

(51) Int. Cl.
*H03F 3/191* (2006.01)
*H04N 5/44* (2011.01)
*H03F 3/193* (2006.01)
*H03F 3/195* (2006.01)
*H03F 1/56* (2006.01)
*H04N 5/455* (2006.01)

(52) U.S. Cl.
CPC ................ *H04N 5/44* (2013.01); *H03F 1/565* (2013.01); *H03F 3/193* (2013.01); *H03F 3/195* (2013.01); *H04N 5/455* (2013.01); *H03F 3/191* (2013.01)

(58) Field of Classification Search
CPC ................ H03F 2200/451; H03F 3/19; H03F 2200/294; H03F 3/193; H03F 2203/21139; H03F 3/45188; H03F 1/223; H03F 1/3211; H03F 2203/45058; H03F 2203/45638; H03F 2203/45641; H03F 2203/45642; H03F 2203/45
USPC ................... 330/86, 278, 282, 285, 294, 305
See application file for complete search history.

(56) References Cited

U.S. PATENT DOCUMENTS

| | | | |
|---|---|---|---|
| 5,264,806 A * | 11/1993 | Kobayashi | 330/294 |
| 7,081,796 B2 | 7/2006 | Krone | |
| 7,489,200 B2 * | 2/2009 | Chang et al. | 330/311 |
| 7,973,603 B2 | 7/2011 | Kammula | |
| 8,264,281 B1 * | 9/2012 | Rajendran et al. | 330/301 |
| 8,294,520 B2 * | 10/2012 | Borremans | 330/294 |
| 8,310,311 B2 * | 11/2012 | Wadatsumi | 330/291 |

* cited by examiner

*Primary Examiner* — Khanh V Nguyen
(74) *Attorney, Agent, or Firm* — Polansky & Associates, P.L.L.C.; Paul J. Polansky

(57) ABSTRACT

An amplifier includes a negative gain amplifier, a load element, and a transconductance device. The negative gain amplifier has an input and an output. The load element has a first terminal coupled to a power supply voltage terminal, and a second terminal. The transconductance device has a first current electrode coupled to the second terminal of the load element, a control electrode coupled to the output of the negative gain amplifier, and a second current electrode coupled to the input of the negative gain amplifier.

21 Claims, 2 Drawing Sheets

US 9,094,634 B2

AMPLIFIER FOR TELEVISION TUNER CHIP AND METHOD THEREFOR

FIELD OF THE DISCLOSURE

The present disclosure relates generally to an amplifier circuit and, more particularly to amplifier circuits used in television tuner chips.

BACKGROUND

Receiver circuits are used for both terrestrial and cable reception within televisions, digital video recorders, video cassette records, set-top box devices (such as cable and satellite tuners), frequency modulation (FM) radios, models, and other electronic devices. Some smart phones also utilize receiver circuits for television reception. In general, such receiver circuits include a tuner that selects a narrowband signal from within a wide or broadband signal having multiple channels. The tuner includes bandpass filters, amplifiers, and mixer circuits for selecting a desired channel and for rejecting unwanted channels, noise, and interference.

Television signals can be broadcast at a variety of different frequencies, including ultra-high frequency (UHF), very high frequency (VHF), and high frequency (HF) frequency bands. The International Telecommunications Union (ITU) defines the UHF frequency range as encompassing electromagnetic waves between 300 MHz and 3 GHz. VHF occupies frequencies within a range from approximately 30 MHz to 300 MHz, and HF occupies frequencies within a range from approximately 3 MHz to 30 MHz.

A television receiver processes terrestrial signals with high quality by including low noise amplifier circuits having an exceptional noise figure (NF), since the terrestrial signals generally have a significant signal power difference from channel to channel. Also, a television receiver processes cable television signals with circuits having a certain return loss (RL) to avoid attenuation in the received signal (and with an acceptable NF), since, in a cable environment, the power tends to be relatively even and well-controlled across the channels. In some emerging markets, a television receiver, and in particular, the corresponding circuits of the receiver need both good NF and RL to process quality cable television signals. At the same time, linearity also has to be high. However, some television receiver circuits can interfere with the operation of other corresponding receiver circuits, thus these circuits must accept trade-offs between a good noise figure, a good return loss, and linearity, since it is difficult to achieve all three parameters as desired.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Figure 1:
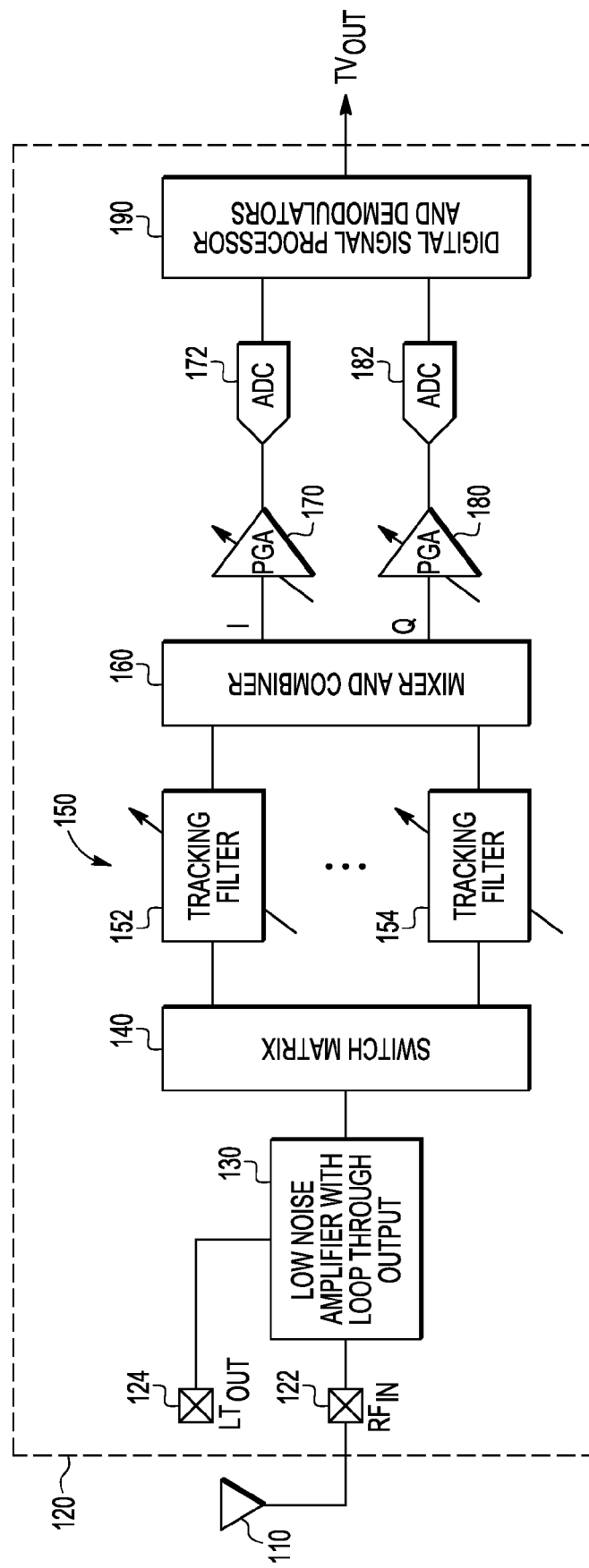
FIG. 1 illustrates in partial block diagram and partial schematic form a television receiver according to one embodiment.

FIG. 1 illustrates in partial block diagram and partial schematic form a television receiver 100 according to one embodiment. For the example shown in FIG. 1, television receiver 100 generally includes an antenna 110 and a television tuner chip 120. Antenna 110 could also be replaced by a coaxial cable or other signal source.

Television tuner chip 120 includes a bonding pad 122 forming a terminal of television tuner chip 120 and receiving an input signal labeled "$RF_{IN}$", a bonding pad 124 forming a terminal of television tuner chip 120 and providing an output signal labeled "$LT_{OUT}$", a low noise amplifier with loop through output 130, a switch matrix 140, a set of tracking filters 150, a mixer and combiner 160, a programmable gain amplifier (PGA) 170, an analog to digital converter (ADC) 172, a PGA 180, an ADC 182, and a digital signal processor (DSP) and demodulators block 190. The set of tracking filters 150 includes representative tracking filters 152 and 154.

Antenna 110 delivers radio frequency (RF) broadcast signals. Bonding pad 122 is connected to antenna 110 to receive the $RF_{IN}$ signal. Amplifier 130 has an input connected to bonding pad 122 to receive the $RF_{IN}$ signal, a first output connected to bonding pad 124 to provide the $LT_{OUT}$ signal, and a second output. Switch matrix 140 has an input connected to the output of amplifier 130, and a set of outputs. Each one of tracking filters 150 has an input connected to a corresponding output of switch matrix 140, and an output. Mixer and combiner 160 has a set of inputs, each connected to a corresponding output of tracking filters 150, a first output for providing an in-phase intermediate frequency (IF) output labeled "I", and a second output for proving a quadrature IF output labeled "Q". PGA 170 has an input connected to the first output of mixer and combiner 160 to receive signal I, a control input, and an output. ADC 172 has an input connected to the output of PGA 170, and an output. PGA 180 has an input connected to the second output of mixer and combiner 160 to receive signal Q, a control input, and an output. ADC 182 has an input connected to the output of PGA 180, and an output. DSP and demodulators block 190 has a first input connected to the output of ADC 172, a second input connected to the output of ADC 182, and an output to provide a signal labeled "$TV_{OUT}$".

In operation, television receiver 100 provides both a good NF for operation of the television receiver and a loop through signal at an output terminal without affecting the RL at the input by using a single amplifier 130. Amplifier 130 receives signal $RF_{IN}$ from antenna 110 at the $RF_{IN}$ bonding pad, and provides an amplified internal signal to switch matrix 140. Switch matrix 140 selects an appropriate tracking filter whose tuning range corresponds to a selected television channel. For example, in television tuner chip 120, tracking filter 152 corresponds to the lowest television channels, while tracking filter 154 corresponds to the highest television channels. Mixer and combiner 160 then mixes the filtered signal with an appropriate local oscillator signal to provide a selected channel at a desired IF, such as 44 MHz and separates the IF signal into in-phase (I) and quadrature (Q) components. The signal levels are adjusted in PGAs 170 and 180, respectively, using well-known automatic gain control (AGC) techniques. ADCs 172 and 182 convert the outputs of PGAs 170 and 180 to digital signals, which DSP and demodulators block 190 processes further in the digital domain and demodulates to form the $TV_{OUT}$ signal.

Amplifier 130 also provides the LT$_{OUT}$ signal for possible use by another tuner. This signal is a broadband signal that allows a subsequent tuner to tune a different channel. As will be explained below, amplifier 130 provides this signal from an internal node without using a separate amplifier that would load the input terminal. In this way, it provides good RL at terminal 124, while also providing a low NF for both outputs of amplifier 130.

Figure 2:
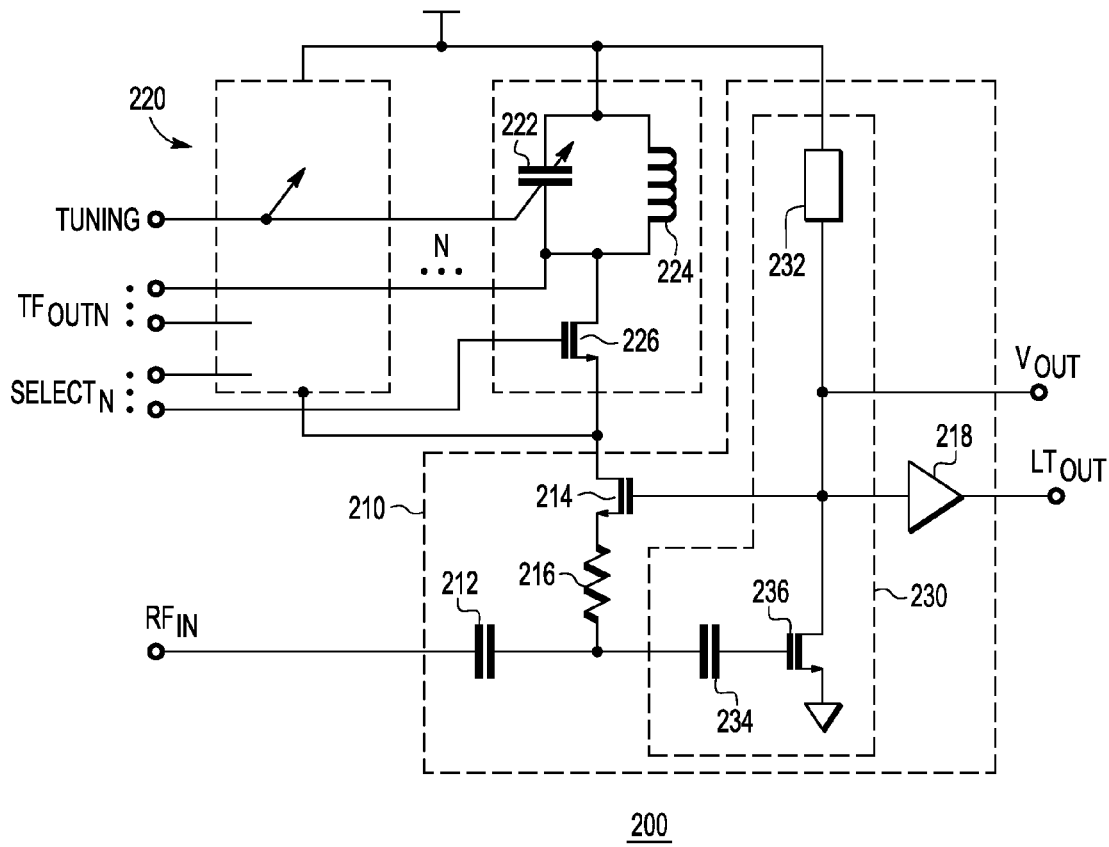
FIG. 2 illustrates in schematic form a portion of a television receiver that that may be used in the television receiver of FIG. 1.

FIG. 2 illustrates in schematic form a portion 200 of a television receiver that that may be used in television receiver 100 of FIG. 1. For the example shown in FIG. 2, portion 200 generally includes a loop through amplifier 210, a set of selectively switchable resonant loads 220, and a negative gain amplifier 230.

Loop through amplifier 210 includes a capacitor 212, a metal oxide semiconductor field effect transistor (MOSFET) 214, a resistor 216, a buffer 218, a load element 232, a capacitor 234, and a MOSFET 236. Capacitor 212 has a first terminal to receive the RF$_{IN}$ signal, and a second terminal. MOSFET 214 has a drain, a gate to receive a signal labeled "V$_{OUT}$", and a source. Resistor 216 has a first terminal connected to the source of MOSFET 214, and a second terminal connected to the second terminal of capacitor 212. Buffer 218 has an input connected to the gate of MOSFET 214 to receive signal V$_{OUT}$, and an output to provide the LT$_{OUT}$ signal. Load element 232 has a first terminal connected to a power supply terminal, and a second terminal to provide signal V$_{OUT}$. The power supply terminal could be a power supply terminal for the whole chip, an internal, local power supply, or a low impedance biasing node. Capacitor 234 has a first terminal connected to the second terminal of capacitor 212, and a second terminal. MOSFET 236 has a drain connected to the second terminal of load element 232 and the input of buffer 218 to provide signal V$_{OUT}$, a gate connected to the second terminal of capacitor 234, and a source connected to a ground terminal. The ground terminal could be a ground terminal for the whole chip or an internal, a local ground terminal, or an internal low impedance ground node. Together load element 232, capacitor 234, and MOSFET 236 form a negative gain amplifier 230.

Each one of resonant loads 220 forms a resonant network that includes a tunable capacitor 222, an inductor 224, and a switch 226. Tunable capacitor 222 has a first terminal connected to the power supply terminal, a second terminal, and a control terminal to receive a signal labeled "TUNING". Inductor 224 has a first terminal connected to the power supply terminal, and a second terminal connected to the second terminal of tunable capacitor 222. Switch 226 has a drain connected to the second terminal of tunable capacitor 222 and the second terminal of inductor 224 to provide one of a set of signals labeled "TF$_{OUTN}$", a gate to receive one of a corresponding set of select signals labeled "SELECT$_N$", and a source connected to the drain of MOSFET 214.

Loop through amplifier 210 amplifies the RF$_{IN}$ signal and provides both a wideband output signal for loop through operation, and a narrowband output signal tuned to a selected channel with low NF, while preserving good RL on the input node. It uses feedback to decouple the NF and RL, and provides a loop through output without loading the input, which could otherwise worsen RL.

In negative gain amplifier 230, MOSFET 236 receives the AC-coupled RF$_{IN}$ signal through capacitors 212 and 234, and converts it into a current at the drain of MOSFET 236 according its transconductance. Negative gain amplifier 230 uses a load element 232 with a relatively small resistance to convert the current into signal V$_{OUT}$ with a high bandwidth. The voltage gain (A$_V$) of negative gain amplifier 230 is equal to:

$$A_V = -g_m \times R_L \qquad [1]$$

in which g$_m$ is the transconductance of MOSFET 236, and R$_L$ is the resistance of load element 232. Signal V$_{OUT}$ is a wideband signal that has a low NF, thus making it suitable for use as (or for generation of) a loop through signal. Buffer 218 is a wideband buffer that provides the LT$_{OUT}$ signal to the corresponding output terminal of the tuner chip.

Loop through amplifier 210 also uses signal V$_{OUT}$ to modulate the conductivity of MOSFET 214. The current signal at the drain of MOSFET 214 is driven into a resonant load, selected by one of switches 226 according to the band of the selected channel. The resonant load is tuned to the center frequency of the selected channel, and TF$_{OUT}$ is a narrowband signal centered around the center frequency of the selected channel. Loop through amplifier 210 uses resistor 216 to improve the linearity of MOSFET 214.

Thus, loop through amplifier 210 is a low noise amplifier with an internal wideband node that can be used to generate a loop through output. Loop through amplifier 210 provides the wideband LT$_{OUT}$ signal with good NF for use by a separate television tuner, while providing good RL as seen by the signal source.

Figure 3:
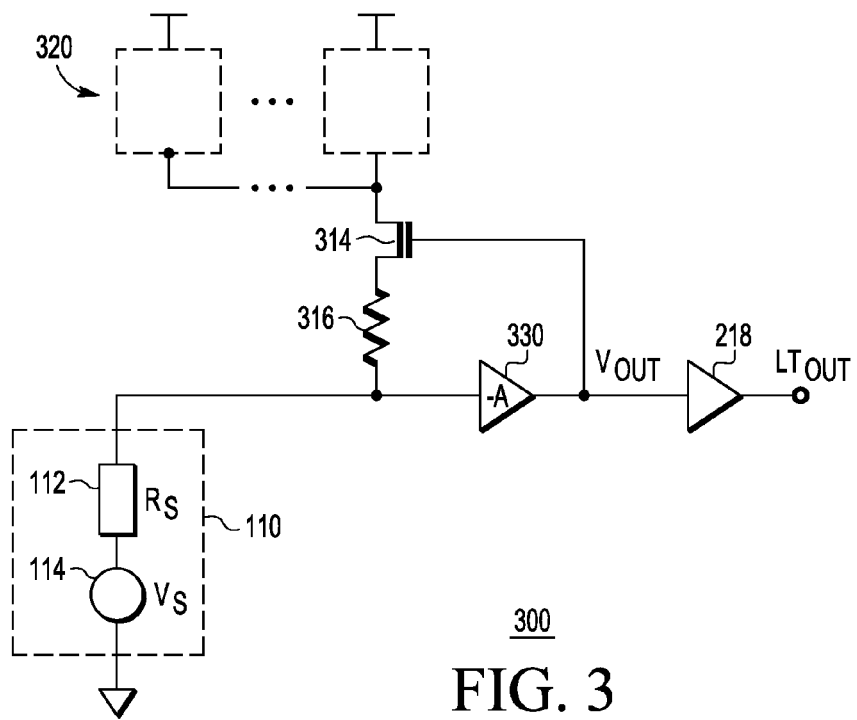
FIG. 3 illustrates in partial block diagram and partial schematic form an electrical model of a portion of a television receiver that may be used to understand the operation of the amplifier of FIG. 2.

FIG. 3 illustrates in partial block diagram and partial schematic form an electrical model 300 of a portion of a television receiver that may be used to understand the operation of amplifier 200 of FIG. 2. Electrical model 300 generally includes antenna 110, buffer 218, a MOSFET 314, a resistor 316, a set of load elements 320, and a negative gain amplifier 330.

Antenna 110 is modeled as a source resistor 112 labeled "R$_S$", and a voltage source 114 labeled "V$_S$". Source resistor 112 has a first terminal and a second terminal. Voltage source 114 has a first terminal connected to the second terminal of source resistor 112, and a second terminal connected to the ground terminal. Buffer 218 has an input to receive signal V$_{OUT}$, and an output to provide the LT$_{OUT}$ signal.

MOSFET 314 has a drain, a gate connected to the input of buffer 218 to receive the voltage signal V$_{OUT}$, and a source. Resistor 316 has a first terminal connected to the source of MOSFET 314, and a second terminal connected to the first terminal of source resistor 112.

Each one of the set of load elements 320 has a first terminal connected to the power supply terminal, and a second terminal connected to the drain of MOSFET 314. Negative gain amplifier 330 as an input connected to the first terminal of source resistor 112 and the second terminal of resistor 316, and an output connected to the input of buffer 218 and the gate electrode of MOSFET 314 to provide signal V$_{OUT}$.

Negative gain amplifier 330 corresponds to negative gain amplifier 230 of FIG. 2. Antenna 110 is modeled as a source resistor 112 in series with a time varying voltage source 114. MOSFET 314, resistor 316, and negative gain amplifier 330 form a negative feedback loop and provide a certain impedance seen by antenna 110. Since voltage source 114 sees R$_S$ 112 plus the certain impedance, antenna 110 generates an RF current signal that flows through resistor 316, MOSFET 314, and resonant loads 220 to provide the TF$_{OUT}$ signal. Also, loop through amplifier 210 amplifies the voltage formed at the input of negative gain amplifier 330, and buffer 218 provides the voltage signal LT$_{OUT}$.

A negative feedback loop is formed by MOSFET 314, resistor 316, source resistor 112, and negative gain amplifier 330. MOSFET 314 and resistor 316 can be treated as a composite device, and its noise contribution to TF$_{OUT}$ is reduced by $(1+A_V)^2$, where AV is the gain of amplifier 330, which is larger than 1. This relationship means that $TF_{OUT}$ noise power due to this composite device is reduced by at least four times, which helps reduce NF significantly. Furthermore, the noise contribution of negative gain amplifier 330 to $TF_{OUT}$ is proportional to its input referred noise voltage. For a given $A_V$, the higher $g_{m1}$ is, the lower its noise contribution is. The input impedance ($R_{in}$) seen by antenna 110 is:

$$R_{in} = \frac{\frac{1}{g_{m2}} + R_{316}}{1 + g_{m1} R_L} \quad [2]$$

in which $g_{m1}$ is the transconductance of the MOSFET in negative gain amplifier 330, $R_L$ is the resistance of the load in negative gain amplifier 330, $g_{m2}$ is the transconductance of MOSFET 314, and $R_{316}$ is the resistance of resistor 316.

By properly choosing the parameters of negative gain amplifier 330, the linearity of MOSFET 314 is boosted by the loop implementation of amplifier 210, so the linearity of the $LT_{OUT}$ signal is scaled based on the linearity of the selected $TF_{OUT}$ signal and the values of $R_S$ and $R_{IN}$. The linearity of negative gain amplifier 330 is also improved due to the feedback loop without needing a high-power and highly linear design. The structure of an amplifier such as amplifier 210 advantageously provides a wideband node that can be used for loop through purposes (i.e. to form signal $LT_{OUT}$) without adding a separate amplifier that loads the $RF_{IN}$ signal and compromises the RL. Moreover, amplifier 210 is configurable. For example, the feedback gain can be increased to reduce the NF and increase the linearity for terrestrial reception.

In various embodiments, the functions of FIGS. 1-3 could be formed on a single integrated circuit or could be formed on multiple integrated circuits using any different number of integrated circuit combinations.

Also FIGS. 2 and 3 show amplifiers 200 and 300 using source degeneration resistors 216 and 316 to improve linearity. In other embodiments, various circuit elements can be coupled to other circuit elements through resistors or other circuit elements to achieve results such as improved linearity.

In other embodiments, MOSFETs 214, 236, and 314 could be replaced by other types of insulated gate field effect transistors (IGFETs) and transconductance devices. In other embodiments, the drain electrode could be any first current electrode, the gate electrode could be any control electrode, and the source electrode could be any second current electrode. For example, MOSFETs 214, 236, and 314 could also be replaced with corresponding bipolar transistors. Moreover, while MOSFETS 214, 236, and 314 are N-channel MOSFETS, other embodiments can use both P-channel and N-channel transistors, with differential or complementary (P-channel/N-channel) architectures. As used herein, "MOSFET" refers to IGFETs regardless of gate type, and thus includes a metal gate device, a silicon gate device, or a silicide gate device.

In FIG. 2, each of resonant loads 220 includes a variable capacitor in parallel with an inductor. In other embodiments, other types of known resonant loads suitable for tuning a 6-8 MHz television channel could be used.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. An amplifier, comprising:
    a negative gain amplifier having an input and an output;
    a load element having a first terminal coupled to a power supply voltage terminal, and a second terminal; and
    a transconductance device having a first current electrode coupled to said second terminal of said load element, a control electrode coupled to said output of said negative gain amplifier, and a second current electrode coupled to said input of said negative gain amplifier,
    wherein said load element comprises a resonant network, said resonant network comprising:
        an inductor having a first terminal coupled to said power supply voltage terminal, and a second terminal coupled to said first current electrode of said transconductance device, and
        a capacitor having a first terminal coupled to said power supply voltage terminal, a second terminal coupled to said first current electrode of said transconductance device.

2. The amplifier of claim 1, wherein said transconductance device comprises an insulated gate field effect transistor.

3. The amplifier of claim 1, wherein the amplifier is formed on an integrated circuit, and said second terminal of said load element is coupled to a terminal of said integrated circuit through a buffer.

4. The amplifier of claim 1, wherein said resonant network has an input for receiving a tuning signal.

5. The amplifier of claim 4, wherein said capacitor comprises a tunable capacitor having a control terminal for receiving said tuning signal.

6. The amplifier of claim 5, wherein said resonant network further comprises:
    a switch coupled between said second terminals of said inductor and said tunable capacitor, and said first current electrode of said transconductance device.

7. The amplifier of claim 4, wherein said resonant network comprises:
    a plurality of selectively switchable resonant networks.

8. The amplifier of claim 7, wherein each of said plurality of selectively switchable resonant networks comprises:
    an inductor having a first terminal coupled to said power supply voltage terminal, and a second terminal;
    a tunable capacitor having a first terminal coupled to said power supply voltage terminal, a second terminal, and a control terminal for receiving said tuning signal; and
    a switch having a first terminal coupled to said second terminals of said inductor and said tunable capacitor, a second terminal coupled to said first current electrode of said transconductance device, and a control electrode for receiving a select signal.

9. An amplifier comprising:
    a first load element having a first terminal coupled to a first power supply voltage terminal, and a second terminal;
    a first transconductance device having a first current electrode coupled to said second terminal of said first load element, a control electrode for receiving an input signal, and a second current electrode coupled to a second power supply voltage terminal;
    a second load element having a first terminal coupled to said first power supply voltage terminal, and a second terminal; and a second transconductance device having a first current electrode coupled to said second terminal of said second load element, a control electrode coupled to said second terminal of said first load element, and a second current electrode coupled to said control electrode of said first transconductance device, wherein said load element comprises a resonant network, said resonant network comprising:
- an inductor having a first terminal coupled to said power supply voltage terminal, and a second terminal coupled to said first current electrode of said transconductance device, and
- a capacitor having a first terminal coupled to said power supply voltage terminal, a second terminal coupled to said first current electrode of said transconductance device.

10. An amplifier comprising:
a first load element having a first terminal coupled to a first power supply voltage terminal, and a second terminal;
a first transconductance device having a first current electrode coupled to said second terminal of said first load element, a control electrode for receiving an input signal, and a second current electrode coupled to a second power supply voltage terminal;
a second load element having a first terminal coupled to said first power supply voltage terminal, and a second terminal; and
a second transconductance device having a first current electrode coupled to said second terminal of said second load element, a control electrode coupled to said second terminal of said first load element, and a second current electrode coupled to said control electrode of said first transconductance device,
wherein said second current electrode of said second transconductance device is coupled to said control electrode of said first transconductance device through:
a resistor having a first terminal coupled to said second current electrode of said second transconductance device, and a second terminal; and
a first capacitor having a first terminal coupled to said second terminal of said resistor, and a second terminal coupled to said control electrode of said first transconductance device.

11. The amplifier of claim 10, wherein the amplifier is formed on an integrated circuit, and said first terminal of said first capacitor is coupled to a first terminal of said integrated circuit, and said second terminal of said first load element is coupled to a second terminal of said integrated circuit through a buffer.

12. The amplifier of claim 9, wherein each of said first and second transconductance devices comprise insulated gate field effect transistors.

13. The amplifier of claim 9, wherein said resonant network has an input for receiving a tuning signal.

14. The amplifier of claim 13, wherein said capacitor comprises:
a tunable capacitor having a control terminal for receiving said tuning signal.

15. The amplifier of claim 14, wherein said resonant network comprises:
a switch coupled between said second terminals of said inductor and said tunable capacitor, and said first current electrode of said second transconductance device.

16. The amplifier of claim 13, wherein said resonant network comprises:
a plurality of selectively switchable resonant networks.

17. The amplifier of claim 16, wherein each of said plurality of selectively switchable resonant networks comprises:
an inductor having a first terminal coupled to said first power supply voltage terminal, and a second terminal;
a tunable capacitor having a first terminal coupled to said first power supply voltage terminal, a second terminal, and a control terminal for receiving said tuning signal and a control terminal for receiving said tuning signal; and
a switch having a first terminal coupled to said second terminals of said inductor and said tunable capacitor, a second terminal coupled to said first current electrode of said second transconductance device, and a control electrode for receiving a select signal.

18. A method comprising:
receiving an RF signal;
amplifying said RF signal by a negative value to form a loop through voltage;
amplifying said loop through voltage by a positive value to provide a current; and
filtering said current according to a resonance value to a reference voltage terminal to form a tracking voltage.

19. The method of claim 18, wherein said filtering further comprises tuning said resonance value using a tuning signal.

20. The method of claim 18 wherein said filtering said current according to said resonance value to said reference voltage terminal comprises forming said resonance value with an inductor coupled in parallel to a capacitor.

21. The method of claim 18 wherein said amplifying said filtering said current according to said resonance value to said reference voltage terminal comprises selectively switching said resonance value and at least one other selectively switched resonance value.

* * * * *